United States Patent
Fujiwara et al.

(10) Patent No.: US 12,040,158 B2
(45) Date of Patent: Jul. 16, 2024

(54) HIGH-FREQUENCY POWER SUPPLY DEVICE AND OUTPUT CONTROL METHOD THEREFOR

(71) Applicant: KYOSAN ELECTRIC MFG. CO., LTD., Yokohama (JP)

(72) Inventors: Takeshi Fujiwara, Yokohama (JP); Hiroyuki Kojima, Yokohama (JP); Satoshi Kawai, Yokohama (JP)

(73) Assignee: KYOSAN ELECTRIC MFG. CO., LTD., Yokohama (JP)

( * ) Notice: Subject to any disclaimer, the term of this patent is extended or adjusted under 35 U.S.C. 154(b) by 124 days.

(21) Appl. No.: 17/908,797

(22) PCT Filed: Mar. 4, 2021

(86) PCT No.: PCT/JP2021/008460
§ 371 (c)(1),
(2) Date: Sep. 1, 2022

(87) PCT Pub. No.: WO2021/187138
PCT Pub. Date: Sep. 23, 2021

(65) Prior Publication Data
US 2023/0134559 A1 May 4, 2023

(30) Foreign Application Priority Data
Mar. 16, 2020 (JP) .................. 2020-045559

(51) Int. Cl.
*H01J 37/32* (2006.01)
(52) U.S. Cl.
CPC .. *H01J 37/32146* (2013.01); *H01J 37/32174* (2013.01)
(58) Field of Classification Search
CPC ........... H01J 37/32146; H01J 37/32165; H01J 37/32174; H01J 37/32183
See application file for complete search history.

(56) References Cited

U.S. PATENT DOCUMENTS 8,962,488 B2 * 2/2015 Liao .................. H01J 37/32082
216/68
11,699,572 B2 * 7/2023 Dorf .................. H01L 21/31116
323/371
(Continued)

FOREIGN PATENT DOCUMENTS

JP H11-214363 A 8/1999
JP 2007-514300 A 5/2007
(Continued)

OTHER PUBLICATIONS

International Search Report dated May 18, 2021, issued in counterpart application No. PCT/JP2021/008460.
(Continued)

*Primary Examiner* — Tung X Le
(74) *Attorney, Agent, or Firm* — WHDA, LLP

(57) ABSTRACT

Provided are a high-frequency power supply device and an output control method therefor which are capable of constantly keeping the phase of the outputted high-frequency pulse uniform even in a structure in which the synchronizing pulse and the clock pulse are generated separately. A high-frequency power supply device and an output control method therefor for outputting a high-frequency pulse to a target device on the basis of a synchronizing pulse and a clock pulse, wherein: the period interval of one period of the synchronizing pulse is detected; the phase difference between the synchronizing pulse and the clock pulse during the previous one period is determined; the number of pulses and oscillation frequency of oscillation in the subsequent period is calculated on the basis of the period interval and the phase difference; a clock pulse is generated on the basis of the oscillation frequency signal; and a number of pulses and oscillation frequency for the subsequent period which will cancel the phase difference in the previous one period are determined in a manner such that the phase remains (Continued)

constant after the period interval of the subsequent period elapses when forming a high-frequency pulse on the basis of the period reference signal, the level setting signal, the pulse number signal and the clock pulse.

8 Claims, 6 Drawing Sheets

(56) References Cited

U.S. PATENT DOCUMENTS

| | | |
|---|---|---|
| 2005/0205532 A1 | 9/2005 | Patrick et al. |
| 2009/0315463 A1* | 12/2009 | Coumou .............. H05H 1/46 |
| | | 315/111.21 |
| 2014/0009073 A1 | 1/2014 | Valcore, Jr. et al. |
| 2014/0302682 A1* | 10/2014 | Muto .............. H01J 37/32146 |
| | | 438/711 |
| 2014/0361690 A1 | 12/2014 | Yamada et al. |
| 2015/0122421 A1 | 5/2015 | Konno et al. |
| 2016/0079037 A1 | 3/2016 | Hirano et al. |
| 2017/0103871 A1 | 4/2017 | An et al. |
| 2018/0115299 A1* | 4/2018 | Nagami ............ H01J 37/32183 |
| 2019/0057843 A1* | 2/2019 | Kaneko ............. H01J 37/32082 |
| 2019/0148112 A1 | 5/2019 | Kaneko et al. |
| 2020/0411286 A1 | 12/2020 | Koshimizu et al. |
| 2021/0358757 A1* | 11/2021 | Shoeb ................ H01J 37/3053 |
| 2022/0216038 A1* | 7/2022 | Wu .................... H01J 37/32183 |

FOREIGN PATENT DOCUMENTS

| | | |
|---|---|---|
| JP | 2019-091526 A | 6/2019 |
| WO | 2019244734 A1 | 12/2019 |

OTHER PUBLICATIONS

Extended (Supplementary) European Search Report dated Mar. 6, 2024, issued in counterpart application No. 21770777.7. (5 pages).

\* cited by examiner

HIGH-FREQUENCY POWER SUPPLY DEVICE AND OUTPUT CONTROL METHOD THEREFOR

TECHNICAL FIELD

The present invention relates to a high-frequency power supply device to be applied to a plasma generation device and others, in particular a high-frequency power supply device for outputting a high-frequency pulse to a target device based on a synchronous pulse and a clock pulse, and to an output control method therefor.

BACKGROUND ART

A high-frequency power supply device is applied as a power source for ultrasonic oscillation, generation of induced power, plasma generation or others, and is a power supply device that combines a synchronous pulse for determining an output period of a high-frequency pulse and a clock pulse for determining a pulse period of a high-frequency component to be oscillated, thereby enabling to output a high-frequency pulse containing a high-frequency component over a predetermined period with a predetermined amplitude value. In particular, as a high-frequency power source to be applied to a plasma generation device, there is a switch-type high-frequency power supply device that has amplitude values respectively at a high level (first level) and a low level (second level) in one oscillation period.

As a plasma processing device adopting the above-mentioned switch-type high-frequency power supply device, for example, Patent Literature 1 discloses a plasma etching device that has a processing chamber filled with etching gas and accommodating a semiconductor wafer to be processed, in which an upper electrode and a lower electrode are disposed to face each other with the wafer to be processed being held between them, and a high-frequency voltage from a high-frequency power source is applied to the upper electrode and the lower electrode to cause electrical discharge between the upper electrode and the lower electrode so as to turn the etching gas into plasma, thereby performing etching process on the wafer to be processed. In such device, in order to perform uniform processing across the wafer to be processed, it is required that a voltage applied from the high-frequency power source is stable.

With a view to generating plasma stably in the plasma etching device, for example, Patent Literature 2 discloses a technique of feedback control, in which a matching network is connected between a high-frequency generator and a plasma processing chamber for converting a complex impedance of plasma viewed from an end of a transmission path into a nominal impedance of the high-frequency generator, so as to perform the feedback control on a voltage of an induction coil for feeding high-frequency power to the plasma processing chamber. According to the control technique, the matching network allows the feedback control to match phases of electric power waveforms applied to the induction coil to thereby stabilize substrate treatment.

CITATION LIST

Patent Literature

[Patent Literature 1] Japanese Patent Laid-Open Publication No. H11-214363

[Patent Literature 2] Japanese Patent Laid-Open Publication No. 2007-514300

SUMMARY OF THE INVENTION

Problems to be Solved by the Invention

As described above, in the conventional high-frequency power supply device, a synchronous pulse generator for generating a synchronous pulse and a clock pulse generator for generating a clock pulse are typically provided separately, and since these generators operate independently, it is inevitable that phases of output waveforms generated based on clock pulses in high-frequency pulses output at timings based on the synchronous pulses are uneven at the time of changing output levels of the high-frequency pulses. As a result, between multiple high-frequency pulses which are consecutively oscillated, the number of pulses due to an amplitude at a first level and the number of pulses due to an amplitude at a second level are different from each other, thereby causing jitter.

In order to solve the above problem caused by the unstable output waveforms due to the oscillation mechanism in such high-frequency power supply device, for example, the above-described technique disclosed by Patent Literature 2 is applied that requires to provide an additional configuration (matching network or similar) between the plasma processing device and the high-frequency power supply device, and thus control of the power source must be complicated. Furthermore, if fluctuation of the output waveform of the high-frequency pulse occurs at speed faster than a response speed of the matching network, it cannot be dealt with the fluctuation, and this does not provide a fundamental solution to the problem that comes up when a switch-type high-frequency power supply device is employed.

The present invention is for solving the above-described conventional problem, and aims to provide a high-frequency power supply device and an output control method therefor that can always match the phases of the output high-frequency pulses even in the configuration of generating the synchronous pulse and the clock pulse separately.

Means for Solving the Problem

In order to solve the above problem, the present invention has a principal aspect that is a high-frequency power supply device for outputting a high-frequency pulse to a target device based on a synchronous pulse and a clock pulse, including a synchronous pulse generation mechanism that generates a synchronous pulse containing output level information and output timing information of the high-frequency pulse; an output level setting mechanism that generates an output level signal for setting an output level of the high-frequency pulse based on the output level information; an oscillation waveform setting mechanism that sends out a frequency setting signal and a pulse number setting signal respectively for setting an oscillation frequency and the number of pulses of the high-frequency pulse based on a phase difference between the synchronous pulse and the clock pulse; and an oscillation mechanism that receives a period reference signal of the synchronous pulse, the output level signal, the frequency setting signal and the pulse number setting signal to oscillate the high-frequency pulse, wherein the synchronous pulse generation mechanism includes a synchronous pulse formation circuit that forms the synchronous pulse, and a period reference signal generation unit that generates a period reference signal at a period reference time contained in the timing information, the output level setting mechanism includes a level determination unit that determines an output level set in the high-frequency pulse in response to the output level signal, and a level setting signal generation unit that generates a level setting signal based on a result of the determination made by the level determination unit, the oscillation waveform setting mechanism includes a synchronous pulse period detection unit that detects a period time of one period of the synchronous pulse, a phase difference determination unit that determines a phase difference between the synchronous pulse and the clock pulse at least in previous one period of the high-frequency pulse, and an output parameter determination unit that computes an oscillation frequency and the number of pulses of the high-frequency pulse to be oscillated in the next period based on the period time and the phase difference to thereby send out an oscillation frequency signal and a pulse number signal, the oscillation mechanism includes a clock pulse generator that generates the clock pulse based on the oscillation frequency signal, and an oscillation amplifier that receives the period reference signal, the level setting signal, the pulse number signal and the clock pulse to form the high-frequency pulse based on these signals, wherein the output parameter determination unit determines the oscillation frequency and the number of pulses in the next period for compensating the phase difference in the last period such that the phase becomes constant after a lapse of the period time of the next period.

Another aspect of the invention is an output control method for a high-frequency power supply device which outputs a high-frequency pulse to a target device based on a synchronous pulse and a clock pulse, the method including generating an output level signal for setting an output level of the high-frequency pulse from output level information contained in a waveform of the synchronous pulse and generating a period reference signal from output timing information, detecting a period time in one period of the synchronous pulse and determining a phase difference between the synchronous pulse and the clock pulse at least in previous one period of the high-frequency pulse, computing an oscillation frequency and the number of pulses of the high-frequency pulse to be oscillated in the next period based on the period time and the phase difference to send out an oscillation frequency signal and a pulse number signal, generating the clock pulse based on the oscillation frequency signal and receiving the period reference signal, the level setting signal, the pulse number signal and the clock pulse, and when forming the high-frequency pulse based on these signals, determining the oscillation frequency and the number of pulses in the next period for compensating the phase difference in the last period such that the phase becomes constant after a lapse of the period time of the next period.

In accordance with the invention having the above-described configuration, a period time in one period of a synchronous pulse is detected and a phase difference between the synchronous pulse and a clock pulse at least in previous one period of a high-frequency pulse is determined, an oscillation frequency and the number of pulses of a high-frequency pulse to be oscillated in the next period are calculated based on the period time and the phase difference to send out an oscillation frequency signal and a pulse number signal, the clock pulse is generated based on the oscillation frequency signal, a period reference signal, a level setting signal, the pulse number signal and the clock pulse are received, and when forming the high-frequency pulse based on these signals, an oscillation frequency and the number of pulses in the next period for compensating the phase difference in the last period are determined such that a phase becomes constant after a lapse of the period time of the next period. Thus, even for a structure in which synchronous pulses and clock pulses are separately generated, the phases of high-frequency pulses that are output can consistently be made uniform.

BEST MODE FOR CARRYING OUT THE INVENTION

A description will now be made about representative illustrative embodiments of a high-frequency power supply device and an output control method therefor according to the present invention by referring to FIGS. 1 to 7.

Figure 1:
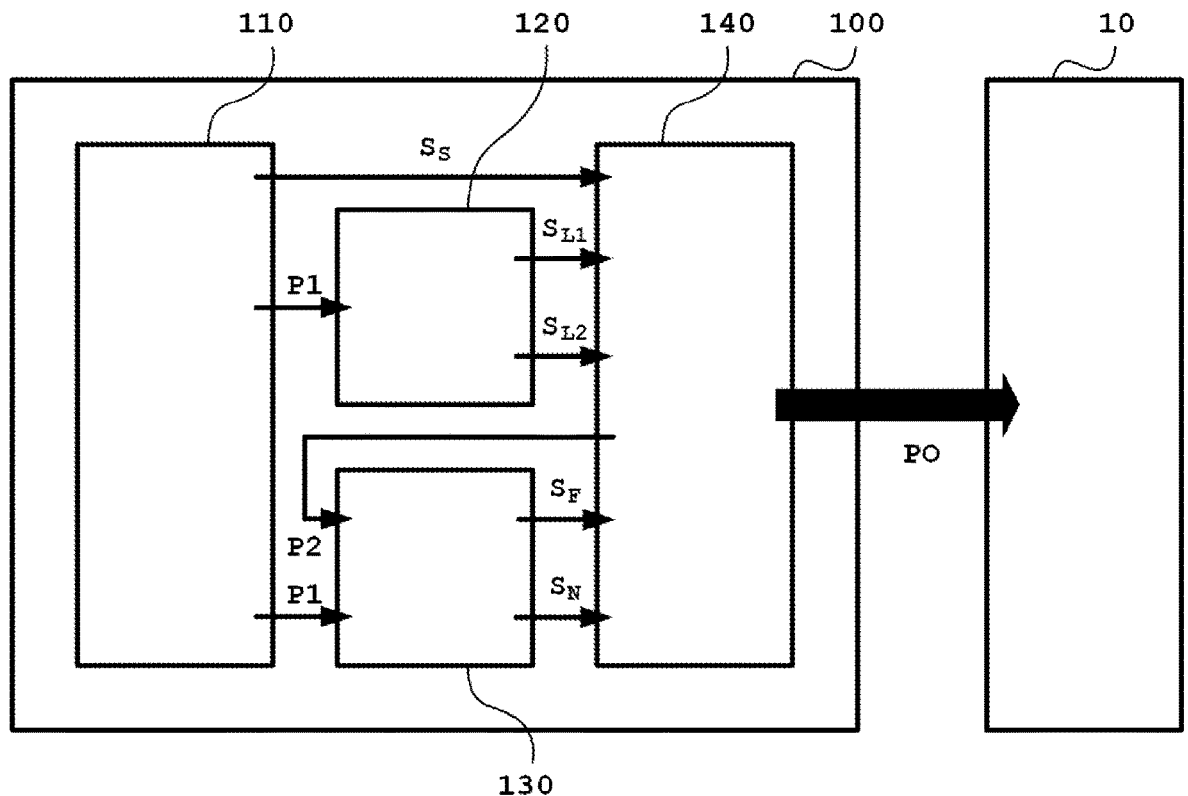
FIG. 1 is a block diagram showing a schematic configuration of a high-frequency power supply device according to a representative example of the invention.

FIG. 1 is a block diagram that shows a schematic configuration of a high-frequency power supply device according to a representative example of the invention. A high-frequency power supply device 100 shown in FIG. 1 includes a synchronous pulse generation mechanism 110 that generates a synchronous pulse P1 that includes output level information and output timing information of a high-frequency pulse PO to be output, an output level setting mechanism 120 that generates output level signals $S_{L1}$, $S_{L2}$ for setting output levels of the high-frequency pulse PO based on the output timing information of the synchronous pulse P1, an oscillation waveform setting mechanism 130 that sends out a frequency setting signal $S_F$ and a pulse number setting signal $S_N$ respectively for setting an oscillation frequency and the number of pulses of the high-frequency PO based on a phase difference between the synchronous pulse P1 and a clock pulse P2, and an oscillation mechanism 140 that receives a period reference signal $S_s$ of the synchronous pulse P1, the output level signals $S_{L1}$ and $S_{L2}$, the frequency setting signal $S_F$ and the pulse number setting signal $S_N$ to thereby oscillate the high-frequency pulse PO. The high-frequency pulse PO output from the high-frequency power supply device 100 is fed to a target device 10, such as plasma or laser generation device, induction heating device, ultrasonic oscillation device or others.

Figure 2:
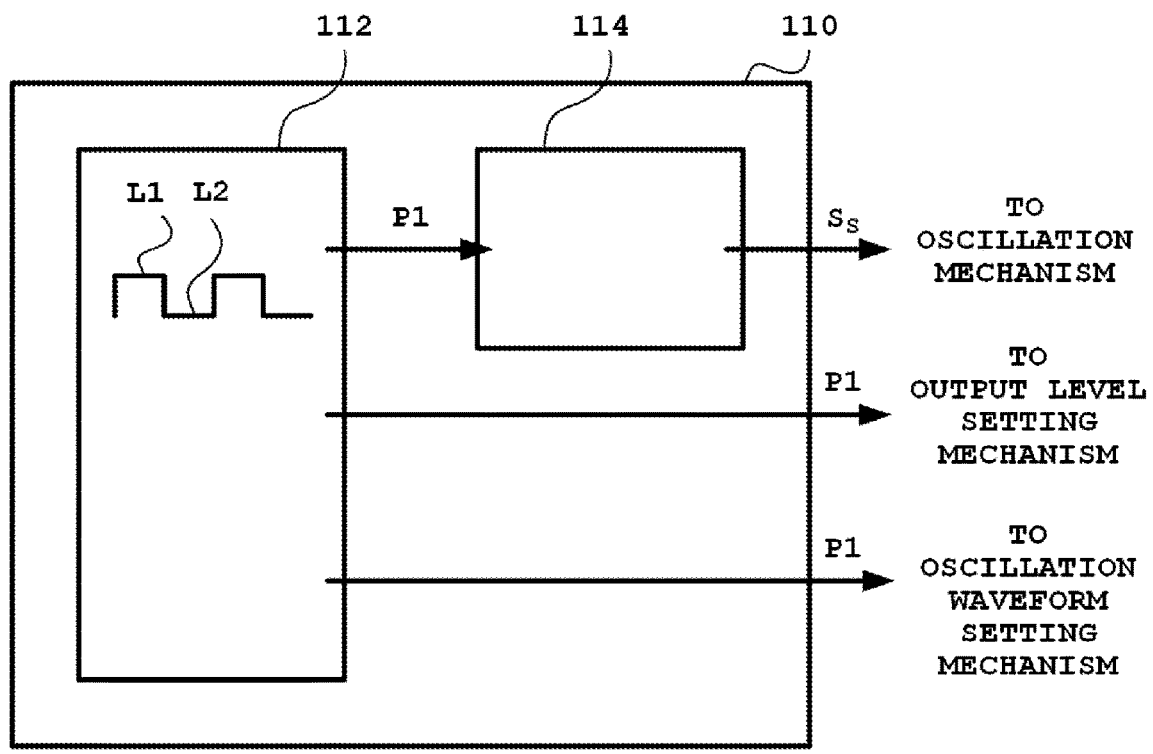
FIG. 2 is a block diagram showing an example of a specific configuration of a synchronous pulse generation mechanism shown in FIG. 1.

FIG. 2 is a block diagram showing an example of a specific configuration of the synchronous pulse generation mechanism shown in FIG. 1. As shown in FIG. 2, the synchronous pulse generation mechanism 110 includes a synchronous pulse formation circuit 112 that forms the above-mentioned synchronous pulse P1, and a period reference signal generation unit 114 that generates the period reference signal $S_s$ at a period reference time in the synchronous pulse P1. In addition to that, the synchronous pulse P1 sent out from the synchronous pulse formation circuit 112 is also fed to the output level setting mechanism 120 and the oscillation waveform setting mechanism 130, about which will be described later.

The synchronous pulse formation circuit 112 includes output level information (e.g. amplitude value) and output timing information (e.g. amplitude changing timing), by way of example, and outputs approximately rectangular periodic pulse waveform that defines two output levels L1, L2 on a vertical axis with respect to an elapsed time on a horizontal axis. Although FIG. 2 illustrates the case where the output levels are the high level L1 and the low level L2, the pulse waveform may have three or more output levels as long as the waveform is an approximately rectangular periodic wave.

In addition to that, the synchronous pulse P1 is not limited to the rectangular wave, and may include any waveform that contains the output level information and the output timing information, such as sine wave or extremely-short pulse. Furthermore, the synchronous pulse P1 may consist of a plurality of signal waveforms. For example, there is a technique for performing AND operation on a plurality of signal waveforms to obtain an output level and output timing.

The period reference signal generation unit 114 uses the synchronous pulse P1 received from the synchronous pulse formation circuit 112 to identify the output timing information which is a time reference of a period as one of the features of this synchronous pulse P1, and outputs the period reference signal $S_s$ at the identified timing. In this context, the time reference of the period is a time of switching from the low level L2 to the high level L1 (rising time), by way of example. Moreover, the number of the period reference signals $S_s$ is not limited to one in one period, and for example, a time of switching from the high level L1 to the low level L2 (falling time) may be employed, in addition to the above-mentioned rising time from the low level L2 to the high level L1.

Figure 3:
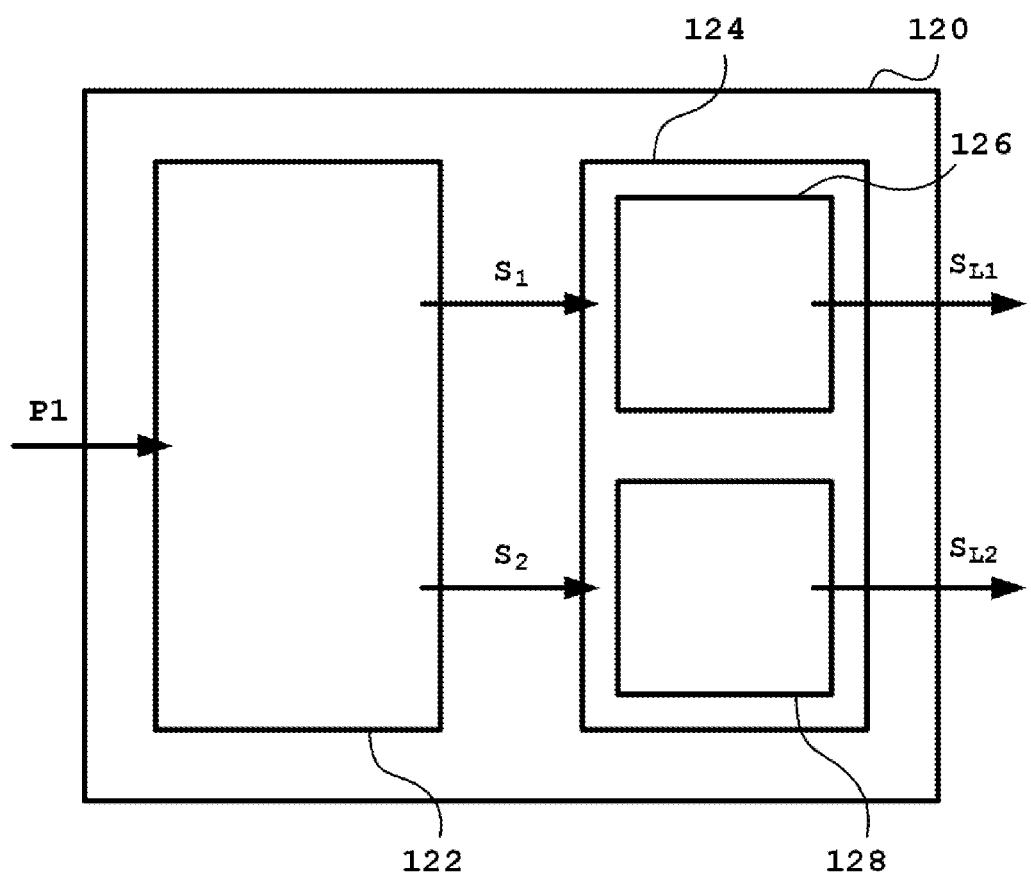
FIG. 3 is a block diagram showing an example of a specific configuration of an output level setting mechanism shown in FIG. 1.

FIG. 3 is a block diagram showing an example of a specific configuration of the output level setting mechanism shown in FIG. 1. As shown in FIG. 3, the output level setting mechanism 120 includes a level determination unit 122 for issuing a first level setting command $S_1$ or a second level setting command $S_2$ in accordance with an amplitude value (output level information) of the synchronous pulse P1, and a level setting signal generation unit 124 for generating a level setting signal (first level setting signal $S_{L1}$ or second level setting signal $S_{L2}$) in response to the first level setting command $S_1$ and the level 2 setting command $S_2$. Furthermore, the level setting signal generation unit 124 includes a first level setting signal generator 126 for generating the first level setting signal $S_{L1}$ while the first level setting command $S_1$ is being received, and a second level setting signal generator 128 for generating the second level setting signal $S_{L2}$ while the second level setting command $S_2$ is being received.

The level determination unit 122 is configured to receive the synchronous pulse P1 from the synchronous pulse formation circuit 112, and send out a predetermined setting command in real time according to the output level of the received synchronous pulse P1. For example, the level determination unit 122 sends out the first level setting command $S_1$ while the synchronous pulse P1 is at the high level L1, and when the level of the synchronous pulse P1 is changed to the low level L2, sends out the second level setting command $S_2$.

In an illustrative embodiment shown in FIG. 3, the level setting signal generation unit 124 is configured to include the first level setting signal generator 126 and the second level setting signal generator 128, but can include three or more level setting signal generator. In addition to that, the first level setting signal generator 126 is configured to, upon receipt of the first level setting command $S_1$ from the level determination unit 122, send out the first level setting signal $S_{L1}$ to the oscillation mechanism 140 during receiving the command. Correspondingly, the second level setting signal generator 128 is configured to, upon receipt of the second level setting command $S_2$ from the level determination unit 122, send out the second level setting signal $S_{L2}$ to the oscillation mechanism 140 during receiving the command.

Figure 4:
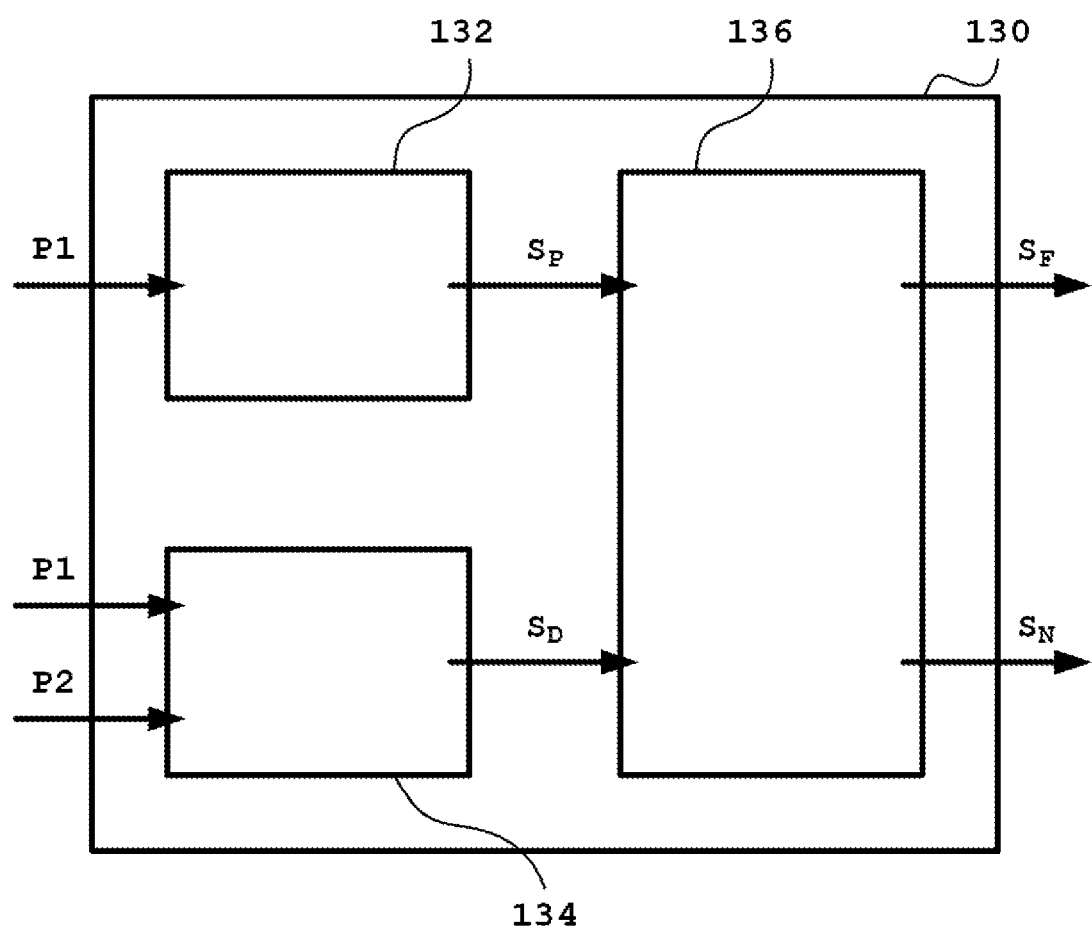
FIG. 4 is a block diagram showing an example of a specific configuration of an oscillation waveform setting mechanism shown in FIG. 1.

FIG. 4 is a block diagram showing an example of a specific configuration of the oscillation waveform setting mechanism shown in FIG. 1. As shown in FIG. 4, the oscillation waveform setting mechanism 130 includes a synchronous pulse period detection unit 132 that detects a period time $T_n$ of one period of a synchronous pulse P1 received from the synchronous pulse generation mechanism 110, a phase difference determination unit 134 that determines a phase difference ΔP between a synchronous pulse P1 and a clock pulse P2 at least in previous one period of a high-frequency pulse PO, and an output parameter determination unit that computes an oscillation frequency and the number of pulses of the high-frequency pulse PO to be oscillated in the next period based on the period time $T_n$ and the phase difference ΔP to thereby send out an oscillation frequency signal $S_F$ and a pulse number signal $S_N$.

The synchronous pulse period detection unit 132 detects the period time $T_n$ (n is a natural number) in each period of the synchronous pulse P1 received from the synchronous pulse generation mechanism 110, so as to send out a period time signal $S_P$ that includes continuously the period time $T_n$ in each period. By way of example, the synchronous pulse period detection unit 132 receives the synchronous pulse P1 in conjunction with the period reference signal generation unit 114, and then measures an interval (time) each time the period reference signal $S_s$ is sent out to use the measured interval as period time $T_n$ for each period.

The phase difference determination unit 134 receives the synchronous pulse P1 from the synchronous pulse generation mechanism 110 and the clock pulse P2 from the oscillation mechanism 140, and in turn computes the phase difference ΔP between these signals to output a computation result as a phase difference signal $S_D$. For example, the phase difference determination unit 134 refers to a time of sending the synchronous reference signal $S_s$ in the synchronous pulse P1 sent out from the synchronous pulse period detection unit 132 to calculate a difference as phase difference ΔP between the referred time and a time in the same phase (e.g. rising edge) of the subsequent clock pulse P2.

The output waveform parameter determination unit 136 computes an oscillation frequency and the number of pulses of a high-frequency pulse PO to be oscillated in the next period based on the period time signal $S_P$ received from the synchronous pulse period detection unit 132 and the phase difference signal $S_D$ received from the phase difference determination unit 134, and sends out the oscillation frequency signal $S_F$ and the pulse number signal $S_N$ to the oscillation mechanism 140. In this connection, the pulse number signal $S_N$ is determined such that the number of pulses is specified for each frequency value of the oscillation frequency signal $S_F$. Furthermore, for example, the period time signal $S_F$ and the phase difference signal $S_D$ determined based on the synchronous pulse P1 and the clock pulse P2 of the high-frequency pulse PO currently oscillated are applied to waveform control for a high-frequency pulse PO in the next period as a transmission frequency and the number of pulses computed based on these signals. As a consequence, the phases of the high-frequency pulse PO are matched at an end time in the next period (start time of a period after next).

The output waveform parameter determination unit 136 selects, as an example of the determined oscillation frequency, from three frequencies, i.e., an intermediate frequency which is a reference frequency, a smaller-part frequency which is smaller than the reference frequency, and a larger-part frequency which is larger than the reference frequency. In this case, differences between the intermediate frequency and the larger-part frequency and between the intermediate frequency and the smaller-part frequency are determined based on the characteristics of an amplifier, filter and others incorporated in hardware (e.g. ultrasonic oscillator, plasma processing device, etc.) to which the high-frequency power supply device of the present invention is applied, and the differences are set to be ±3% of the intermediate frequency. Then, the oscillation frequency thus determined is multiplied by a predetermined number of pulses to vary a pulse width (time) of each pulse included in one period.

Furthermore, the output waveform parameter determination unit 136 may be configured to determine the oscillation frequency and the number of pulses such that phases after a lapse of the above-described period time in the next period (end time) coincides with timing of rising or falling edge of the pulse at all times.

Figure 5:
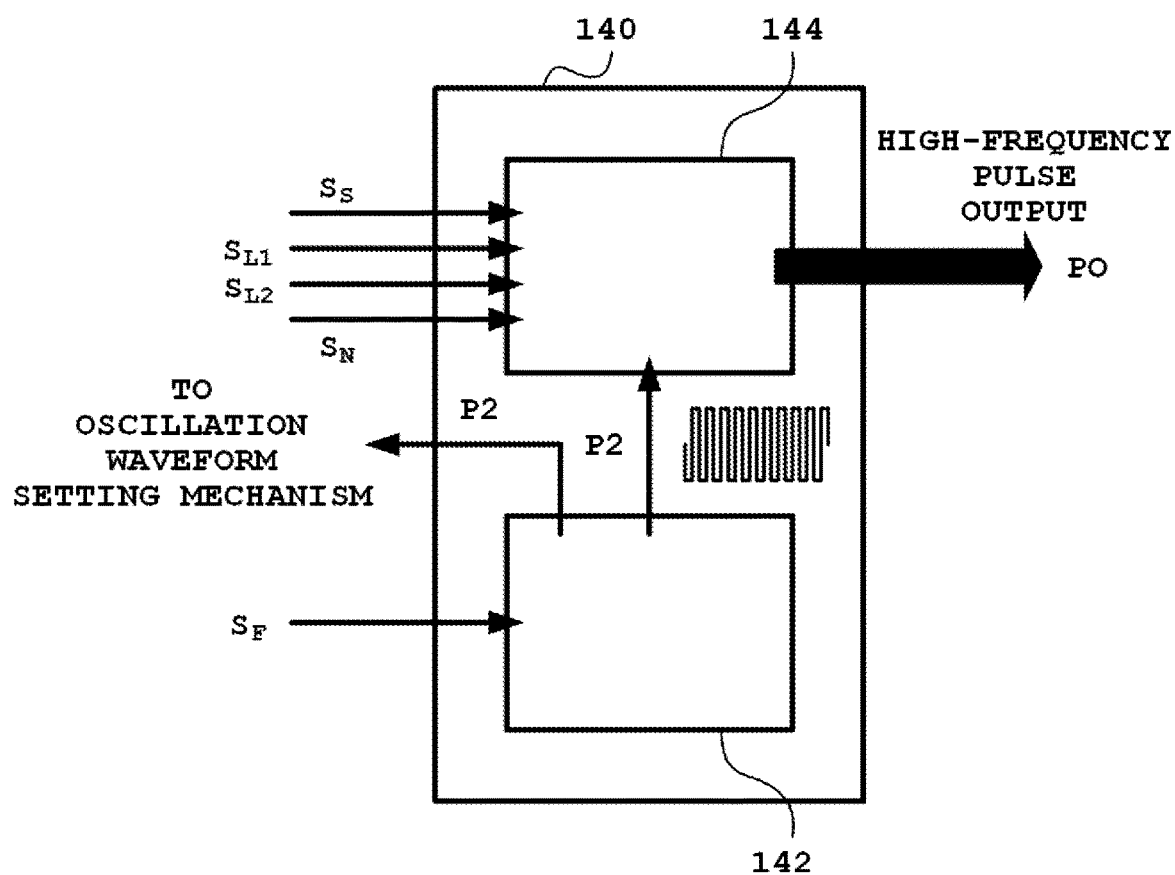
FIG. 5 is a block diagram showing an example of a specific configuration of an oscillation mechanism shown in FIG. 1.

FIG. 5 is a block diagram showing an example of a specific configuration of the oscillation mechanism shown in FIG. 1. As shown in FIG. 5, the oscillation mechanism 140 includes a clock pulse generator 142 that generates a clock pulse P2 in a predetermined high-frequency range based on an oscillation frequency signal $S_F$ received from the oscillation waveform setting mechanism 130, and an oscillation amplifier 144 that receives a period reference signal $S_s$ from the synchronous pulse generation mechanism 110, a first level setting signal $S_{L1}$ and a second level setting signal $S_{L2}$ from the output level setting mechanism 120, a pulse number signal $S_N$ from the oscillation waveform setting mechanism 130 and the above-mentioned clock pulse P2 to form a high-frequency pulse PO based on these signals.

The clock pulse generator 142 is for generating the clock pulse P2 at high frequency (several hundreds of kHz to several tens of MHz) according to the output of the high-frequency pulse PO based on the oscillation frequency signal $S_F$ received from the oscillation waveform setting mechanism 130, e.g. generating the clock pulse P2 of 13.56 MHz. In this case, the clock pulse generator 142 can adopt any technique, such as technique that shifts the frequency to a corresponding frequency each time the oscillation frequency indicated by the received oscillation frequency signal $S_F$ is switched.

Furthermore, the oscillation amplifier 144 determines oscillation timing for the high-frequency pulse PO based on the period reference signal $S_s$, and amplifies the amplitude value of the clock pulse P2 based on the first level setting signal $S_{L1}$ and the second level setting signal $S_{L2}$ to generate and oscillate the high-frequency pulse PO. In this case, the oscillation amplifier 144 continuously outputs the high-frequency pulse PO at a frequency and the number of pulses specified by the pulse number signal $S_N$ that corresponds to the oscillation frequency signal $S_F$.

Figure 6:
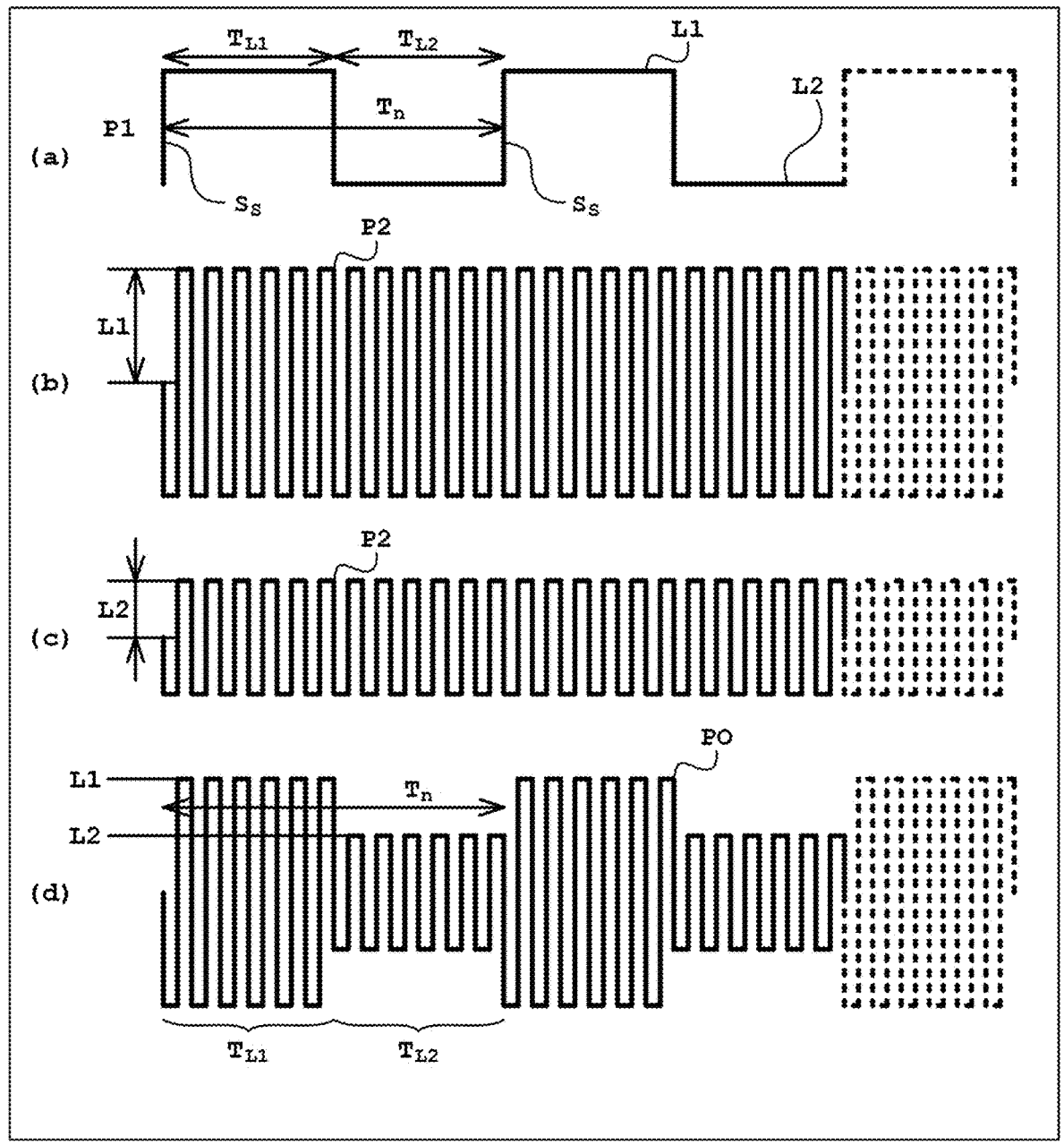
FIG. 6 is a graph showing an example of an output waveform of a high-frequency pulse obtained by the high-frequency power supply device shown in FIG. 1.

FIG. 6 is a graph showing an example of an output waveform of a high-frequency pulse that can be obtained by the high-frequency power supply device shown in FIG. 1. In the high-frequency power supply device 100 shown in FIG. 1, the synchronous pulse P1 formed by the synchronous pulse formation circuit 112 in the synchronous pulse generation mechanism 110 is formed as a periodic pulse signal that will be at the high level L1 at an interval of a time $T_{L1}$ and at the low level L2 at an interval of a time $T_{L2}$, as shown in FIG. 6(a). Then, as described above, a rising time to the high level L1, which is a time reference of one pulse period, is derived from the concerned synchronous pulse P1, and the period reference signal generation unit 114 sends out the period reference signal $S_s$ at each rising time to the oscillation mechanism 140, by way of example.

As described above, the synchronous pulse P1 is fed also to the output level setting mechanism 120, and thereby the output level for each time is set in the level determination unit 122 of the output level setting mechanism 120. Then, the first level setting signal generator 126 or the second level setting signal generator 128 continuously sends out the first level setting signal $Sui$ or the second level setting signal $S_{L2}$ to the oscillation mechanism 140. More specifically, by referring to FIG. 6(a), the first level setting signal $S_{L1}$ is sent out at an interval of time $T_{L1}$ and the second level setting signal $S_{L2}$ is sent out at an interval of time $T_{L2}$.

Then, the oscillation amplifier 144 in the oscillation mechanism 140 amplifies an amplitude value of a clock pulse P2 in accordance with the received first level setting signal $S_{L1}$ or second level setting signal $S_{L2}$. More specifically, when the first level setting signal $S_{L1}$ is received continuously, continuous pulses having average height of the clock pulse P2 at the high level L1 are output, as shown in FIG. 6(b). Correspondingly, when the second level setting signal $S_{L2}$ is received continuously, continuous pulses having average height of the clock pulse P2 at the low level L2 are output, as shown in FIG. 6(c).

When the above operation is performed continuously from the generation of the synchronous pulse P1 with the change of time, the pulses are continuously generated from the time the oscillation mechanism 140 receives the period reference signal $S_s$ as shown in FIG. 6(d), so that the continuous pulses at the high level L1 are oscillated at the interval of time $T_{L1}$. Similarly, the continuous pulses at the low level L2 are oscillated at the interval of time $T_{L2}$. Consequently, the high-frequency pulse PO at an interval of one period $T_n$ (n is a natural number) is output.

Figure 7:
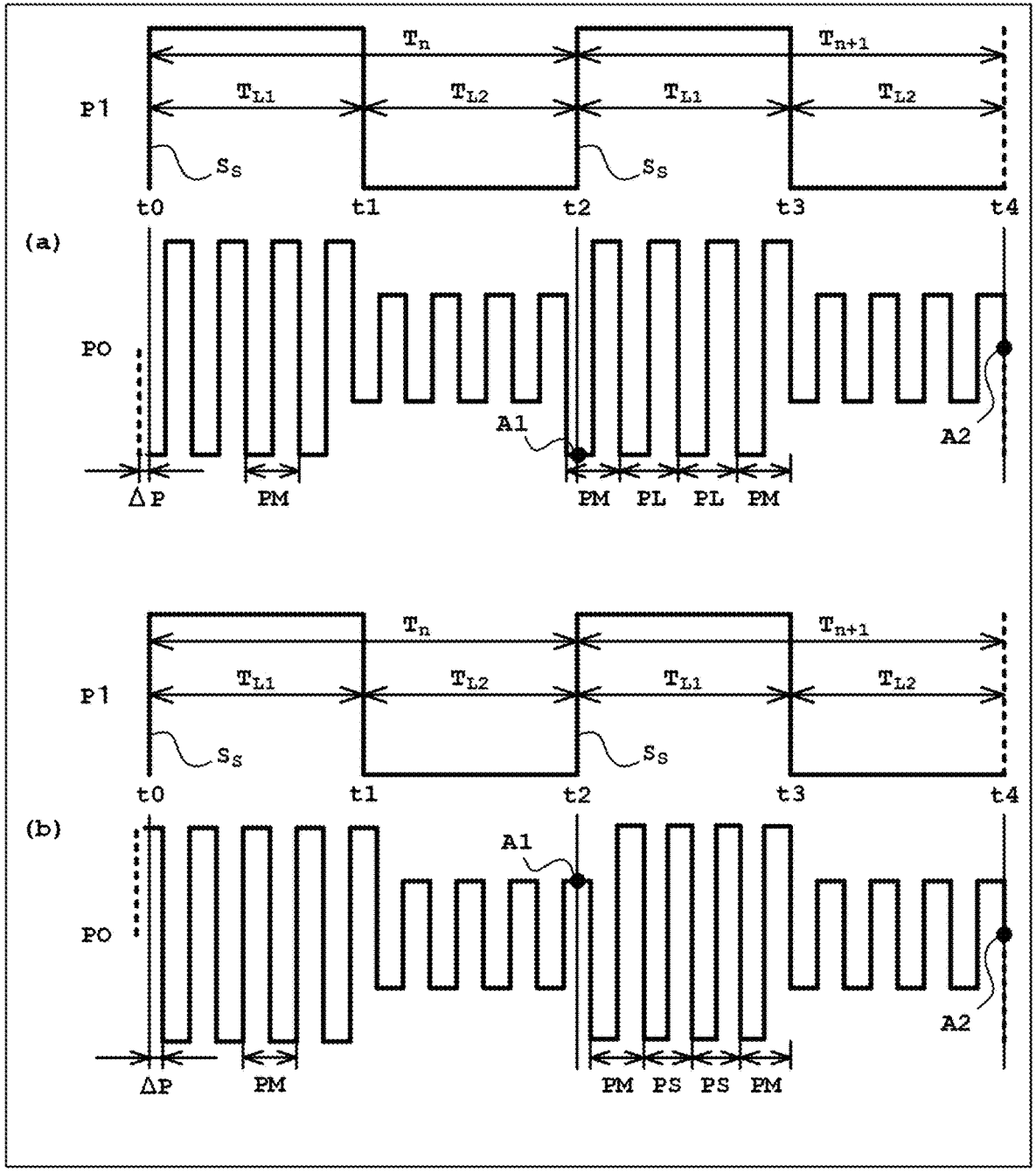
FIG. 7 a graph showing an example of an output waveform obtained by an output control method for the high-frequency power supply device according to a representative example of the invention.

FIG. 7 is a graph showing an example of an output waveform obtained by an output control method for the high-frequency power supply device in accordance with a representative example of the present invention. For ease of description, FIG. 7 illustrates the case where eight pulses are included at each period time $T_n$. However, if an oscillation frequency of the high-frequency pulse PO is around 400 kHz, for instance, about 30 pulses are included in one period, and if the oscillation frequency at high-frequency in 13.56 MHz, 1,000 or more pulses are included in one period. The output control method for the high-frequency power supply device in accordance with the representative example of the invention detects, as shown in FIG. 7(a), a phase difference between the synchronous pulse P1 and the clock pulse P2 in one period of the period time $T_n$ that are output by the output operation of the high-frequency pulse PO described in FIGS. 1 to 6.

More specifically, if the pulse frequency of one pulse of the clock pulse P2 is formed of the continuous pulses at the above-described intermediate frequency PM, for example, the phase difference ΔP between the synchronous pulse P1 and one pulse of the output high-frequency pulse PO is detected at a start time to of the period time $T_n$ (i.e. time of sending the period reference signal $S_s$). In this case, it should be noted that the phase difference ΔP is not just a horizontal axis, but means an elapsed time in an output change in one pulse, and the intermediate frequency PM is almost equal to the integral multiple of the synchronous pulse P1.

Then, at an interval from a start time t2 of a subsequent period time $T_{n+1}$ to the time $T_{L1}$, a predetermined number of frequency-modulated pulses are oscillated. More specifically, when a pulse at the intermediate frequency PM is used as a reference, for example, a value N is selected for the number of pulses (N is a natural number) such that a phase difference becomes ΔP when the larger-part frequency PL is used as a substitute.

$$\left(\frac{1}{PL} - \frac{1}{PM}\right) \times N = \Delta P \quad 1$$

That is to say, as an example, the value N for the number of pulses that satisfies the above Formula 1 is selected.

In this case, if the intermediate frequency PM is not equal to the integral multiple of the synchronous pulse P1, a period difference α between the synchronous pulse P1 and the clock pulse P2 is added to the right-hand side of Formula 1 to thereby take into account the period difference α. However, in the case where the difference between the intermediate frequency PM and the above-mentioned integral multiple is set to be lower than a resolution of the clock pulse generator 142, the period difference a can be omitted.

Thus, at an end time t4 in the next period $T_{n+1}$, the phase difference ΔP between the synchronous pulse P1 and the high-frequency pulse PO due to the clock pulse P2 is eliminated. That is to say, the output waveform has the phase difference ΔP at an amplitude value A1 at the time t2, whereas the phase difference is corrected to zero at an amplitude value A2 at the time t4. In this regard, a phase of the corresponding pulse is preferably adjusted to always coincide with the timing of the rising edge or falling edge of the pulse at the time t4 after the correction.

As shown in FIG. 7(b), based on a pulse at the intermediate frequency PM, the pulse number N may be selected such that the phase difference is ΔP when the frequency is replaced with the smaller-part frequency PS, by way of example.

$$\left(\frac{1}{PM} - \frac{1}{PS}\right) \times N = \Delta P \quad 2$$

That is to say, as an example, the value N for the number of pulses that satisfies the above Formula 2 is selected.

Thus, as with the case of FIG. 7(a), at an end time t4 in the next period $T_{n+1}$, the phase difference ΔP between the synchronous pulse P1 and the high-frequency pulse PO due to the clock pulse P2 is eliminated. That is to say, the output waveform has the phase difference ΔP at the amplitude value A1 at the time t2, whereas the phase difference is corrected to zero at the amplitude value A2 at the time t4.

With the above configuration, the high-frequency power supply device and the output control method therefor in accordance with the present invention detect the period time $T_n$ in one period of the synchronous pulse P1, determine the phase difference ΔP between the period pulse P1 and the clock pulse P2 at least in the previous one period of the high-frequency pulse PO, compute a oscillation frequency and the number of pulses of the high-frequency pulse PO to be oscillated in the next period based on the period time $T_n$ and the phase difference ΔP to thereby send out the oscillation frequency signal $S_F$ and the pulse number signal $S_N$, generate the clock pulse P2 based on the oscillation frequency signal $S_F$, receive the period reference signal $S_s$, the first level setting signal $S_{L1}$ and the second level setting signal $S_{L2}$, the pulse number signal $S_N$, and the clock pulse P2, and when forming the high-frequency pulse based on these signals, determine an oscillation frequency and the number of pulses in the next period for compensating the phase difference ΔP in the last period such that the phase becomes constant after a lapse of the period time $T_{n+1}$ of the next period. Thus, even for a structure in which synchronous pulses and clock pulses are generated separately, the phases of high-frequency pulses that are output can consistently be made uniform.

The descriptions in the above embodiments are a few examples of the high-frequency power supply device and the output control method therefor of the present invention, and thus the present invention is not limited thereto. Furthermore, those skilled in the art can modify the present invention in various ways based on the gist of the invention, which modifications are not be excluded from the scope of the present invention.

For example, the embodiments illustrate the control operation of compensating the phase difference ΔP due to the pulse modulation in the interval of the time Tri in one period of the high-frequency pulse PO. Alternatively, control of compensating the phase difference ΔP may be performed only in the interval of the time $T_{L2}$ or simultaneously in two intervals. This makes it possible to perform the output control for eliminating the phase difference finely in shorter time.

REFERENCE SIGNS LIST

10 Target Device
100, High-Frequency Power Supply Device
110 Synchronous Pulse Generation Mechanism
112 Synchronous Pulse Formation Circuit
114 Period Reference Signal Generation Unit
116 Clocking Mechanism
120 Output Level Setting Mechanism
122, 222, 322 Level Determination Unit
124 Level Setting Signal Generation Unit
126 First Level Setting Signal Generator
128 Second Level Setting Signal Generator
130 Oscillation Waveform Setting Mechanism
132 Synchronous Pulse Period Detection Unit
134 Phase Deference Determination Unit
136 Output Waveform Parameter Determination Unit
140 Oscillation Mechanism
142 Clock Pulse Generator
144 Oscillation Amplifier
PO High-Frequency Pulse
P1 Synchronous Pulse
P2 Clock Pulse $S_s$ Period Reference Signal
$S_{L1}$ First Level Setting Signal
$S_{L2}$ Second Level Setting Signal
$S_F$ Oscillation Frequency Signal
$S_N$ Pulse Number Signal
$T_n$, $T_{n+1}$ Period Time

The invention claimed is:

1. A high-frequency power supply device for outputting a high-frequency pulse to a target device based on a synchronous pulse and a clock pulse, comprising:
a synchronous pulse generation mechanism that generates the synchronous pulse containing output level information and output timing information of the high-frequency pulse; an output level setting mechanism that generates an output level signal for setting an output level of the high-frequency pulse based on the output level information; an oscillation waveform setting mechanism that sends out a frequency setting signal and a pulse number setting signal respectively for setting an oscillation frequency and the number of pulses of the high-frequency pulse based on a phase difference between the synchronous pulse and the clock pulse; and an oscillation mechanism that receives a period reference signal of the synchronous pulse, the output level signal, the frequency setting signal and the pulse number setting signal to oscillate the high-frequency pulse, wherein
the synchronous pulse generation mechanism comprises a synchronous pulse formation circuit that forms the synchronous pulse, a period reference signal generation unit that generates a period reference signal at a period reference time contained in the output timing information,
the output level setting mechanism comprises a level determination unit that determines an output level set in the high-frequency pulse in response to the output level signal, and a level setting signal generation unit that generates a level setting signal based on a result of the determination made by the level determination unit,
the oscillation waveform setting mechanism comprises a synchronous pulse period detection unit that detects a period time in one period of the synchronous pulse; a phase difference determination unit that determines a phase difference between the synchronous pulse and the clock pulse at least in previous one period of the high-frequency pulse; and an output parameter determination unit that computes an oscillation frequency and the number of pulses of the high-frequency pulse to be oscillated in the next period based on the period time and the phase difference to thereby send out an oscillation frequency signal and a pulse number signal,
the oscillation mechanism comprises a clock pulse generator that generates the clock pulse based on the oscillation frequency signal, and an oscillation amplifier that receives the period reference signal, the level setting signal, the pulse number signal and the clock pulse to generate the high-frequency pulse based on these signals, and
the output parameter determination unit determines an oscillation frequency and the number of pulses in the next period for compensating the phase difference in the last period such that the phase becomes constant after a lapse of the period time of the next period.

2. The high-frequency power supply device according to claim 1, wherein the level setting signal includes a first level setting signal for defining a first output level of the high-frequency pulse and a second level setting signal for defining a second output level of the high-frequency pulse, and
the level setting signal generation unit comprises a first level setting signal generator that generates the first level setting signal, and a second level setting signal generator that generates the second level setting signal.

3. The high-frequency power supply device according to claim 1, wherein the oscillation frequency consists of an intermediate frequency which is a reference frequency, a smaller-part frequency which is smaller than the intermediate frequency, and a larger-part frequency which is larger than the intermediate frequency.

4. The high-frequency power supply device according to claim 1, wherein the output parameter determination unit determines the oscillation frequency and the number of pulses such that phases after a lapse of the period time in the next period coincides with timing of rising or falling edge of the synchronous pulse at all times.

5. An output control method for a high-frequency power supply device that outputs a high-frequency pulse to a target device based on a synchronous pulse and a clock pulse, comprising:
generating an output level signal for setting an output level of the high-frequency pulse from output level information contained in a waveform of the synchronous pulse, and generating a period reference signal from output timing information;
generating a level setting signal based on the output level signal;
detecting a period time in one period of the synchronous pulse, and determining a phase difference between the synchronous pulse and the clock pulse at least in previous one period of the high-frequency pulse;
computing an oscillation frequency and the number of pulses of the high-frequency pulse to be oscillated in the next period based on the period time and the phase difference to thereby send out an oscillation frequency signal and a pulse number signal;
generating the clock pulse based on the oscillation frequency signal, and receiving the period reference signal, the level setting signal, the pulse number signal and the clock pulse, and when forming the high-frequency pulse based on these signals; and
determining the oscillation frequency and the number of pulses in the next period for compensating the phase difference in the last period such that the phase becomes constant after a lapse of the period time of the next period.

6. The output control method for the high-frequency power supply device according to claim 5, wherein the level setting signal includes a first level setting signal for defining a first output level of the high-frequency pulse, and a second level setting signal for defining a second output level of the high-frequency pulse.

7. The output control method for the high-frequency power supply device according to claim 5, wherein the oscillation frequency consists of an intermediate frequency which is a reference frequency, a smaller-part frequency which is smaller than the intermediate frequency, and a larger-part frequency which is larger than the intermediate frequency.

8. The output control method for the high-frequency power supply device according to claim 5, wherein the oscillation frequency and the number of pulses are determined such that phases after a lapse of the period time in the next period coincides with timing of rising or falling edge of the pulse at all times.

* * * * *